(12) United States Patent
Jang et al.

(10) Patent No.: US 11,482,410 B2
(45) Date of Patent: Oct. 25, 2022

(54) APPARATUS INCLUDING LIGHT SOURCE SUPPLYING LIGHT TO WAFER AND WINDOW PROTECTOR RECEIVING A PORTION OF CHEMICAL LIQUID

(71) Applicant: SAMSUNG ELECTRONICS CO., LTD., Suwon-si (KR)

(72) Inventors: Hunjae Jang, Suwon-si (KR); Seungmin Shin, Suwon-si (KR); Kuntack Lee, Suwon-si (KR); Seungho Kim, Seongnam-si (KR); Younghoo Kim, Yongin-si (KR); Taehong Kim, Seoul (KR); Sunghyun Park, Daegu (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/398,219

(22) Filed: Aug. 10, 2021

(65) Prior Publication Data

US 2022/0230872 A1 Jul. 21, 2022

(30) Foreign Application Priority Data

Jan. 15, 2021 (KR) .................. 10-2021-0005789

(51) Int. Cl.
*H01L 21/02* (2006.01)
*B08B 3/08* (2006.01)
*B08B 7/00* (2006.01)
*B08B 3/10* (2006.01)

(52) U.S. Cl.
CPC .......... *H01L 21/02057* (2013.01); *B08B 3/08* (2013.01); *B08B 3/10* (2013.01); *B08B 7/0035* (2013.01)

(58) Field of Classification Search
CPC ....... H01L 21/02057; B08B 3/08; B08B 3/10; B08B 7/0035
See application file for complete search history.

(56) References Cited

U.S. PATENT DOCUMENTS

| | | | |
|---|---|---|---|
| 9,553,003 B2 | 1/2017 | Hayashi et al. | |
| 10,682,674 B2 | 6/2020 | Jung et al. | |
| 2011/0120650 A1 | 5/2011 | Asako et al. | |
| 2012/0080061 A1* | 4/2012 | Kim ................ | H01L 21/67028 34/427 |
| 2017/0047233 A1 | 2/2017 | Kaneda et al. | |

(Continued)

FOREIGN PATENT DOCUMENTS

JP 2006086411 3/2006

*Primary Examiner* — Erin F Bergner
(74) *Attorney, Agent, or Firm* — F. Chau & Associates, LLC

(57) ABSTRACT

A wafer-cleaning apparatus includes an inner pin that supports a wafer. The wafer-cleaning apparatus further includes a nozzle disposed above the inner pin, a light source disposed under the inner pin, a window disposed between the light source and the wafer, and a window protector disposed between the wafer and the window. The nozzle supplies a chemical liquid to the wafer and the inner pin distributes a portion of the chemical liquid on an upper surface of the wafer by rotating the wafer. The window protector receives a portion of the chemical liquid that flows out of the wafer and the light source supplies the light to the wafer through the window protector and the window.

20 Claims, 9 Drawing Sheets

(56) References Cited

U.S. PATENT DOCUMENTS

2020/0251358 A1    8/2020  Cha et al.
2020/0335361 A1   10/2020  Jang et al.
2021/0202280 A1*   7/2021  Kim .................. B23K 26/0608

* cited by examiner

APPARATUS INCLUDING LIGHT SOURCE SUPPLYING LIGHT TO WAFER AND WINDOW PROTECTOR RECEIVING A PORTION OF CHEMICAL LIQUID

CROSS-REFERENCE TO RELATED APPLICATIONS

This application claims priority under 35 U.S.C. § 119 to Korean Patent Application No. 10-2021-0005789, filed on Jan. 15, 2021 in the Korean Intellectual Property Office, the disclosure of which is incorporated by reference herein in its entirety.

TECHNICAL FIELD

The present disclosure relates to a wafer-cleaning apparatus and a method of cleaning a wafer, and in particular to a wafer-cleaning apparatus including a window protector.

DISCUSSION OF RELATED ART

A wet-cleaning process may be useful in a semiconductor manufacturing process. A wet-cleaning process may be a wet-etching process of chemically removing layers from the surface of a wafer with a high-temperature chemical liquid. A wet-cleaning process may be performed with batch equipment or with single-wafer processing equipment.

SUMMARY

Embodiments of the inventive concept provide a wafer-cleaning apparatus and a method of cleaning a wafer that promote a uniform etching rate.

According to an embodiment of the inventive concept, a wafer-cleaning method includes supplying, by a nozzle included in a wafer-cleaning apparatus, a first amount of a chemical liquid to a wafer, performing a first cleaning process with the first amount of the chemical liquid, performing a rinsing process with a second amount of the chemical liquid, and performing a second cleaning process with a third amount of the chemical liquid. The first cleaning process includes supplying, by a light source included in the wafer-cleaning apparatus, a first light to the wafer and rotating, by an inner pin included in the wafer-cleaning apparatus, the wafer. The rinsing process includes supplying, by the nozzle, the second amount of the chemical liquid to the wafer and rotating, by the inner pin, the wafer. The second cleaning process includes supplying, by the nozzle, the third amount of the chemical liquid to the wafer, supplying, by the light source, fourth light to the wafer, and rotating, by the inner pin, the wafer. A portion of the first amount of the chemical liquid, a portion of the second amount of the chemical liquid, and a portion of the third amount of the chemical liquid are introduced into a window protector.

According to an embodiment of the inventive concept, a wafer-cleaning apparatus includes an inner pin that supports a wafer. The wafer-cleaning apparatus further includes a nozzle disposed above the inner pin, a light source disposed under the inner pin, a window disposed between the light source and the wafer, and a window protector disposed between the wafer and the window. The nozzle supplies a chemical liquid to the wafer and the inner pin distributes a portion of the chemical liquid on an upper surface of the wafer by rotating the wafer. The window protector receives a portion of the chemical liquid that flows out of the wafer and the light source supplies light to the wafer through the window protector and the window.

According to an embodiment of the inventive concept, a wafer-cleaning apparatus includes an inner pin that supports a wafer. The wafer-cleaning apparatus further includes a nozzle disposed above the inner pin and the wafer and an outer pin disposed under the nozzle and on an edge of the wafer and that supports the wafer. The wafer-cleaning apparatus further includes a bowl, a light source disposed under the inner pin, a window disposed between the light source and the wafer, a reflector that connects the light source and an edge of the window, a window protector disposed between the wafer and the window, and a support pin disposed between the window and the window protector and that supports the window protector. The nozzle supplies a chemical liquid to the wafer and the inner pin distributes a portion of the chemical liquid on an upper surface of the wafer by rotating the wafer. The bowl at least partially surrounds the outer pin and blocks outflow of the chemical liquid to outside of the wafer-cleaning apparatus. The window protector receives a portion of the chemical liquid that flows out of the wafer and the light source supplies light to the wafer through the window and the window protector. The window protector includes a tank configured to store the portion of the chemical liquid that is received by the window protector and a drain disposed on an edge of the tank to discharge an excess of the chemical liquid overflowing the tank into the bowl.

BRIEF DESCRIPTION OF THE DRAWINGS

The above and other features of the inventive concept will become more apparent by describing in detail embodiments thereof with reference to the accompanying drawings, in which.

DETAILED DESCRIPTION

Figure 1:
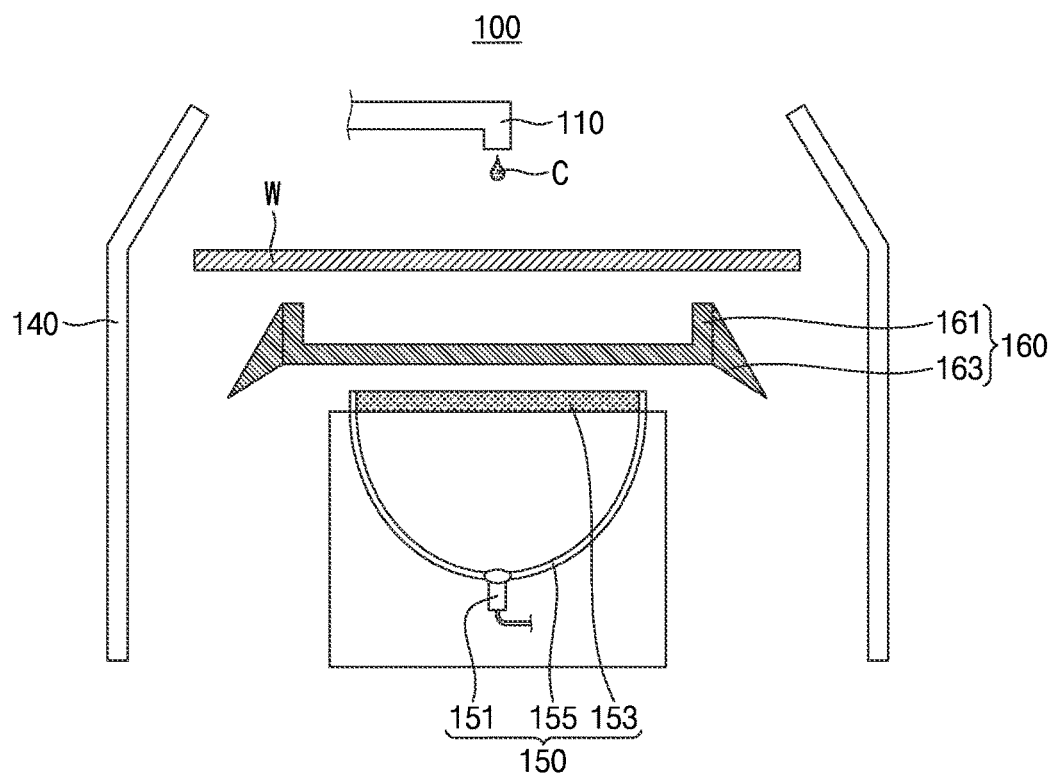
FIG. 1 is a cross-sectional view of a wafer-cleaning apparatus according to an embodiment of the inventive concept.

Embodiments of the inventive concept will be described more fully hereinafter with reference to the accompanying drawings. Like reference numerals may refer to like elements throughout the accompanying drawings.

As used herein, the singular forms "a", "an", and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Figure 2:
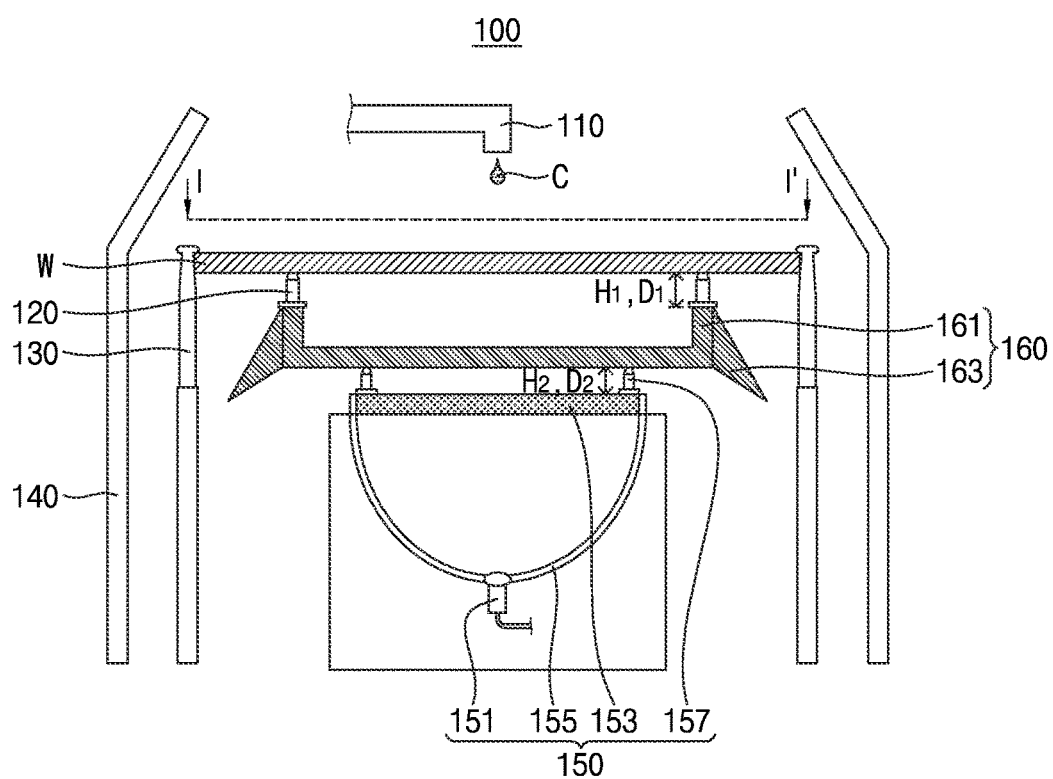
FIG. 2 is a cross-sectional view of the wafer-cleaning apparatus of FIG. 1 viewed from a different angle.
Figure 3:
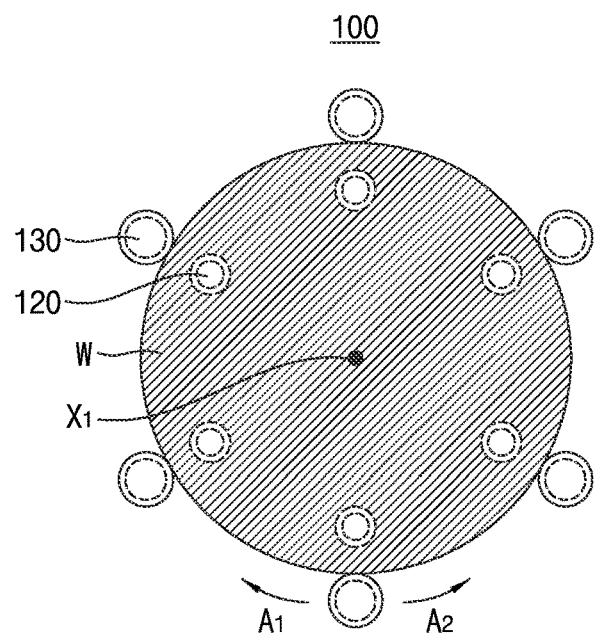
FIG. 3 is a projection view of the wafer-cleaning apparatus of FIG. 2 along line I-I'.
Figure 4:
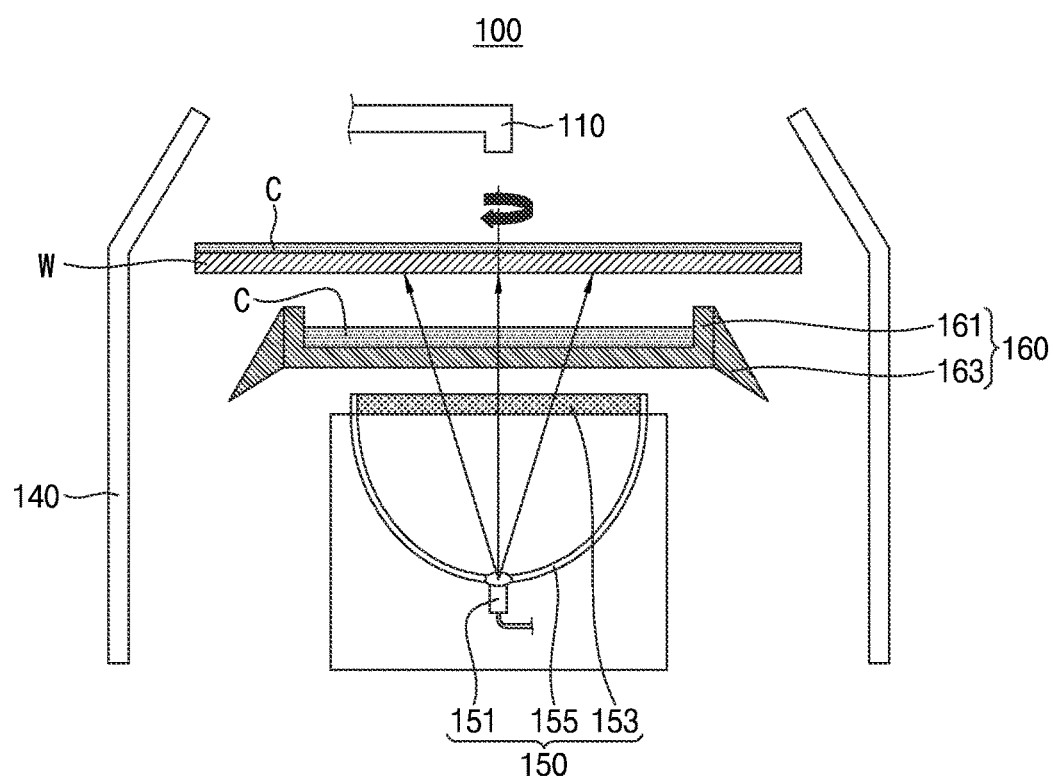
FIGS. 4 and 5 are cross-sectional views of a wafer-cleaning apparatus according to an embodiment of the inventive concept.
Figure 5:
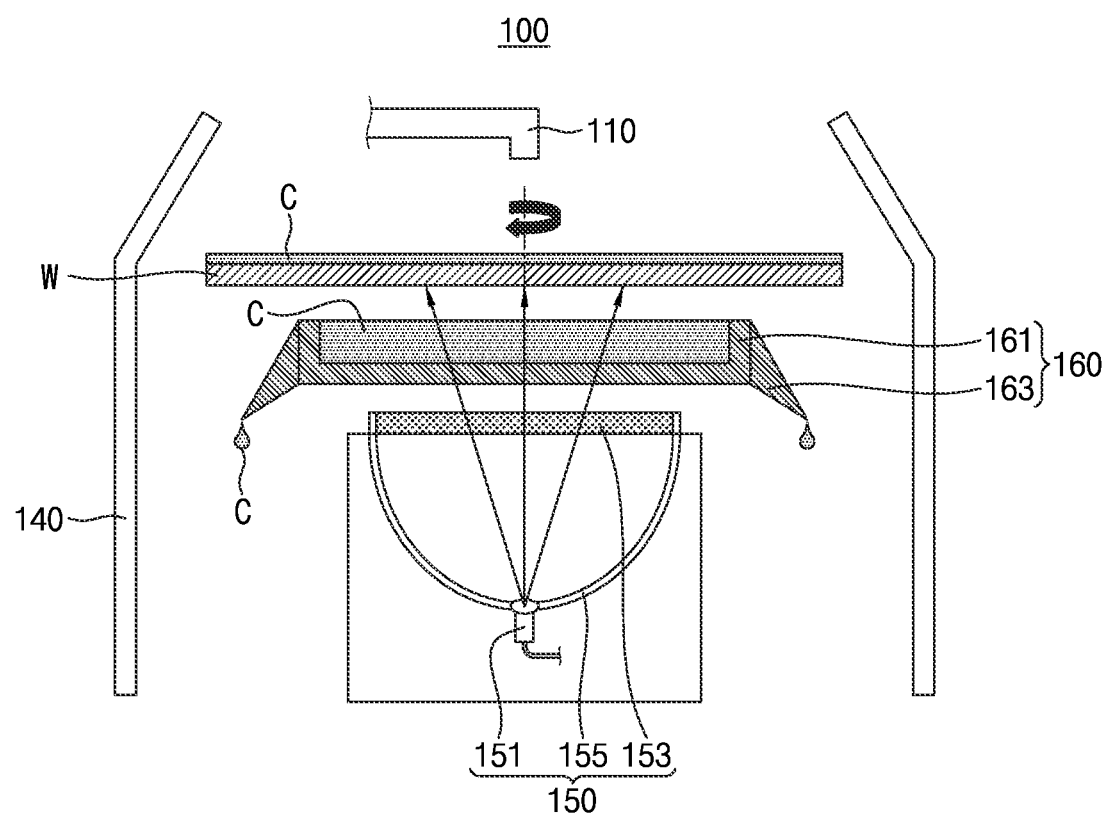

FIG. 1 is a cross-sectional view of a wafer-cleaning apparatus according to an embodiment of the inventive concept. FIG. 2 is a cross-sectional view of the wafer-cleaning apparatus of FIG. 1 viewed from a different angle. FIG. 3 is a projection view of the wafer-cleaning apparatus of FIG. 2 along line I-I'. FIGS. 4 and 5 are cross-sectional views of a wafer-cleaning apparatus according to an embodiment of the inventive concept.

Referring to FIGS. 1 to 5, a wafer-cleaning apparatus 100 may include a nozzle 110, an inner pin 120, an outer pin 130, a bowl 140, a housing 150, and a window protector 160.

The nozzle 110 may be disposed above the window protector 160. The nozzle 110 may supply a chemical liquid C to a wafer W that may be disposed below the nozzle 110. The nozzle 110 may supply the chemical liquid C to the wafer W by spraying the chemical liquid C to the upper surface of the wafer W. The chemical liquid C may be a material that may be used in a cleaning process for the wafer W. For example, the chemical liquid C may remove silicon nitride (SiN) and polysilicon from the upper surface of the wafer W, and may include at least one of phosphoric acid ($H_3PO_4$), ammonium hydroxide ($NH_4OH$), or tetramethylammonium hydroxide (TMAH).

The inner pin 120 may be disposed under the nozzle 110. An upper surface of the inner pin 120 may contact a lower surface of the wafer W. The inner pin 120 may be provided as a plurality of inner pins 120, and the plurality of inner pins 120 may be arranged in a circular shape. The inner pins 120 may be spaced apart from each other at a regular angular interval about the center axis $X_1$ of the wafer W. Although FIG. 3 illustrates that six inner pins 120 are spaced apart from each other by about 60°, embodiments of the inventive concept are not necessarily limited thereto. For example, eight inner pins 120 may be spaced apart from each other by about 45°, or twelve inner pins 120 may be spaced apart from each other by about 30°. The height $H_1$ in a vertical direction of each the inner pins 120 may be about 3 cm or less. Power may be supplied to the inner pins 120 from outside the wafer-cleaning apparatus 100. The inner pins 120 may be rotated in a first direction $A_1$ or a second direction $A_2$ by the power supplied thereto. When the inner pins 120 are rotated in the first direction $A_1$ or the second direction $A_2$, the wafer W supported by the inner pins 120 may also be rotated in the first direction $A_1$ or the second direction $A_2$. Since the wafer W may be rotated by the inner pins 120, the chemical liquid C supplied from the nozzle 110 may be uniformly distributed on the upper surface of the wafer W.

The outer pin 130 may be disposed within the bowl 140 and may contact an edge of the wafer W. The outer pin 130 may be provided as a plurality of outer pins 130, and the plurality of outer pins 130 may be spaced apart from each other at a regular interval about the center axis $X_1$ of the wafer W. The outer pins 130 may be spaced apart from each other at a regular angular interval. The number of outer pins 130 may be the same as the number of inner pins 120. The outer pins 130 may be movable in the vertical direction. When the outer pins 130 move upwards in the vertical direction, the outer pins 130 may contact an edge of the wafer W and may support the wafer W in a horizontal direction that is perpendicular to the vertical direction. When the outer pins 130 move downwards in the vertical direction, the outer pins 130 may be separated from the edge of the wafer W and may not support the wafer W in the horizontal direction.

The bowl 140 may at least partially surround the outer pins 130. The bowl 140 may block outflow of the chemical liquid C to outside of the wafer-cleaning apparatus 100 during rotation of the wafer W, and may block outflow of fumes that may be formed by evaporation of the chemical liquid C, to outside of the wafer-cleaning apparatus 100.

The housing 150 may be disposed under the inner pins 120. The housing 150 may include a light source 151, a window 153, a reflector 155, and a support pin 157. The light source 151 may be disposed at beneath the window 153. In an embodiment, the light source may be implemented as a lamp, an LED, or the like. The light source 151 may supply light to the wafer W. The light source 151 may supply light to the wafer W through the window 153 and the window protector 160. The light source 151 may increase or maintain the temperature of the wafer W by supplying light to the wafer W. For example, a wavelength of light supplied by the light source 151 may range from about 400 nm to about 1,100 nm. The light supplied by the light source 151 may not be absorbed by the chemical liquid C, but may pass through the chemical liquid C and may increase or maintain the temperature of the wafer W. Further, the light supplied by the light source 151 may not be absorbed by the chemical liquid C, and thus no fumes may be formed by the chemical liquid C.

The window 153 may be disposed above the reflector 155. The window 153 may have a rectangular-shaped cross-section. The window 153 may be made of a transparent material so that light from the light source may pass therethrough. For example, the window 153 may include quartz, but the window 153 may alternatively or additionally include other materials.

The reflector 155 may connect the light source 151 and the edge of the window 153. The reflector 155 may have a semicircular-shaped cross-section. The lower portion of the reflector 155 may contact an edge of the light source 151 and may support the light source 151 in the horizontal direction. The upper portion of the reflector 155 may contact an edge of the window 153 and may support the window 153 in the horizontal direction. In an embodiment, a portion of the light supplied to the wafer W by the light source 151 may not be absorbed by the wafer W, but may be reflected by the wafer W. The reflector 155 may reflect the light that is not absorbed by the wafer W so that the light is again supplied to the wafer W. In an embodiment, the reflector 155 may be implemented as a mirror.

The support pin 157 may be disposed above the window 153 and the reflector 155. Although it is illustrated in the drawings that the support pin 157 is disposed on the window 153, the support pin 157 may be disposed on the reflector 155. The support pin 157 may be provided as a plurality of support pins 157, and the plurality of support pins 157 may be arranged in a circular shape. For example, six support pins 157 may be spaced apart from each other by about 60°, eight support pins 157 may be spaced apart from each other by about 45°, or twelve support pins 157 may be spaced apart from each other by about 30°. The height $H_2$ in the vertical direction of the support pins 157 may be about 10 cm or less. In an embodiment, the support pins 157 may be omitted.

The window protector 160 may be disposed above the housing 150. The window protector 160 may be disposed on the support pins 157 and may be supported by the support pins 157 in the vertical direction. The window protector 160 may include a tank 161 and a drain 163. The window protector 160 may be made of a transparent material so that light from the light source 151 may pass therethrough. In an embodiment, the window protector 160 may include the same material as the window 153. For example, the window protector 160 may include quartz.

The tank 161 may be spaced apart from the wafer W by a first distance $D_1$ in the vertical direction. The first distance $D_1$ may be the same as the height $H_1$ of the inner pins 120. In an embodiment, the tank 161 may be spaced apart from the window 153 by a second distance $D_2$ in the vertical direction. The second distance $D_2$ may be the same as the height $H_2$ of the support pins 157. In an embodiment in which the support pins 157 are omitted, the tank 161 may contact the window 153. The tank 161 may include an open top. An interior bottom surface and an exterior bottom surface of the tank 161 may be parallel to an upper surface of the window 153.

The drain 163 may be disposed outside the tank 161. The drain 163 may be formed in the shape of a ring that surrounds the tank 161. In an embodiment, the drain 163 may have a triangular-shaped cross-section. An inner surface of the drain 163 may contact an outer side surface of the tank 161. An upper surface and a lower surface of the drain 163 may respectively extend in downwardly sloping directions from an upper end and a lower end of the outer side surface of the tank 161. The upper surface and the lower surface of the drain 163 may be disposed at angles to a surface of the wafer W. A length of the upper surface of the drain 163 may be greater than a length of the lower surface of the drain 163.

Referring to FIG. 4, the chemical liquid C may be introduced into the tank 161 from the wafer W. When the wafer W rotates, the chemical liquid C may flow out of the wafer W, and a portion of the chemical liquid C that flows out of the wafer W may be introduced into the tank 161. For example, a portion of the chemical liquid C that flows out of the wafer W may be introduced into the tank 161 via the bowl 140, or may be introduced into the tank 161 via a surface of the wafer W. Accordingly, the tank 161 may prevent the chemical liquid C from flowing to the window 153, thereby preventing the window 153 from being contaminated by the chemical liquid C.

A surface of the chemical liquid C introduced into the tank 161 may be kept level by surface tension. The surface of the chemical liquid C introduced into the tank 161 may be parallel in the horizontal direction to the interior bottom surface of the tank 161. That is, the surface of the chemical liquid C introduced into the tank 161 may be parallel to the upper and lower surfaces of the window 153 and the exterior bottom surface and the interior bottom surface of the tank 161. Therefore, the light supplied from the light source 151 to the wafer W through the tank 161 may reach the wafer W without being scattered by the tank 161, and an etching rate of the wafer W may be uniform irrespective of the position of the wafer W.

Referring to FIG. 5, the chemical liquid C may flow from the tank 161 to the drain 163. When more than a predetermined amount of chemical liquid C is introduced into the tank 161, an excess of the chemical liquid C may overflow the tank 161 and may flow to the drain 163. The excess of the chemical liquid C that flows to the drain 163 may drain into the bowl 140 along the upper surface of the drain 163. The predetermined amount of chemical liquid C may be the amount of chemical liquid C that may be stored in the tank 161. In other words, the drain 163 may be disposed on an edge of the tank 161 to discharge the excess of the chemical liquid overflowing the tank 161 into the bowl 140.

Various treatments may be performed on the drain 163 to promote smooth drainage of the chemical liquid C. In an embodiment, a hydrophobic film may be coated on the upper surface of the drain 163. In an embodiment, the drain 163 may be heated by a heat source included in the wafer-cleaning apparatus 100. For example, the drain 163 may be connected to a heating circuit in the wafer-cleaning apparatus 100 that includes a heating element such as a resistor. When at least one of these treatments are performed, the surface tension of the chemical liquid C and an adhesion between the chemical liquid C and the upper surface of the drain 163 may be reduced, and so the chemical liquid C may be smoothly discharged from the drain 163. In an embodiment, fine holes may be formed in the upper surface of the drain 163 and a fluid may be supplied to the holes with a supply device so that the chemical liquid C may be smoothly discharged. In an embodiment, at least one of the inner pins 120 or the support pins 157 may smoothly discharge the chemical liquid C from the drain 163 by vibrating the drain 163 and/or rotating the drain 163. Accordingly, an amount of chemical liquid C that is stored in the tank 161 may be maintained at the predetermined level or less, and other components of the wafer-cleaning apparatus 100 may be protected from the chemical liquid C.

Figure 6:
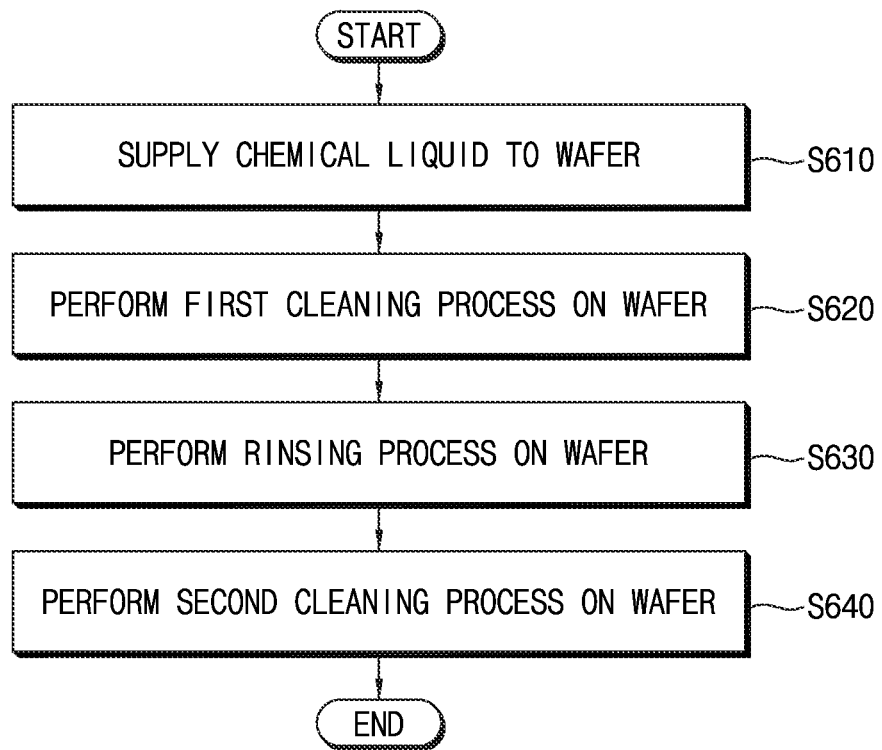
FIG. 6 is a flowchart of a wafer-cleaning method according to an embodiment of the inventive concept.
Figure 7:
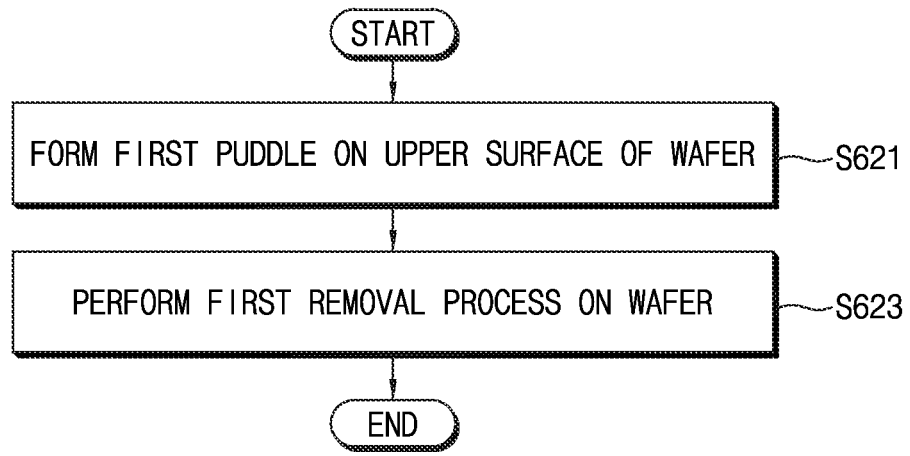
FIG. 7 is a flowchart of a first wafer-cleaning process according to an embodiment of the inventive concept.
Figure 8:
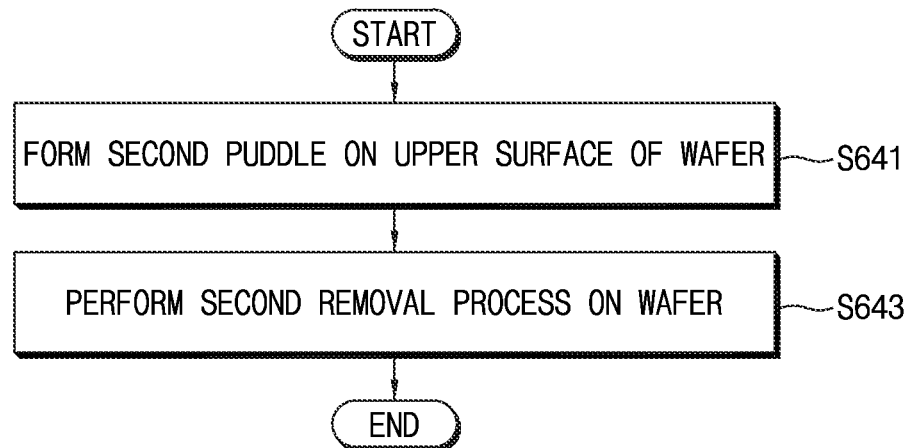
FIG. 8 is a flowchart of a second wafer-cleaning process according to an embodiment of the inventive concept.

FIG. 6 is a flowchart of a wafer-cleaning method according to an embodiment of the inventive concept. FIG. 7 is a flowchart of a first wafer-cleaning process according to an embodiment of the inventive concept. FIG. 8 is a flowchart of a second wafer-cleaning process according to an embodiment of the disclosure. FIGS. 9 to 17 are cross-sectional views that illustrate a wafer-cleaning method according to an embodiment of the inventive concept.

Figure 9:
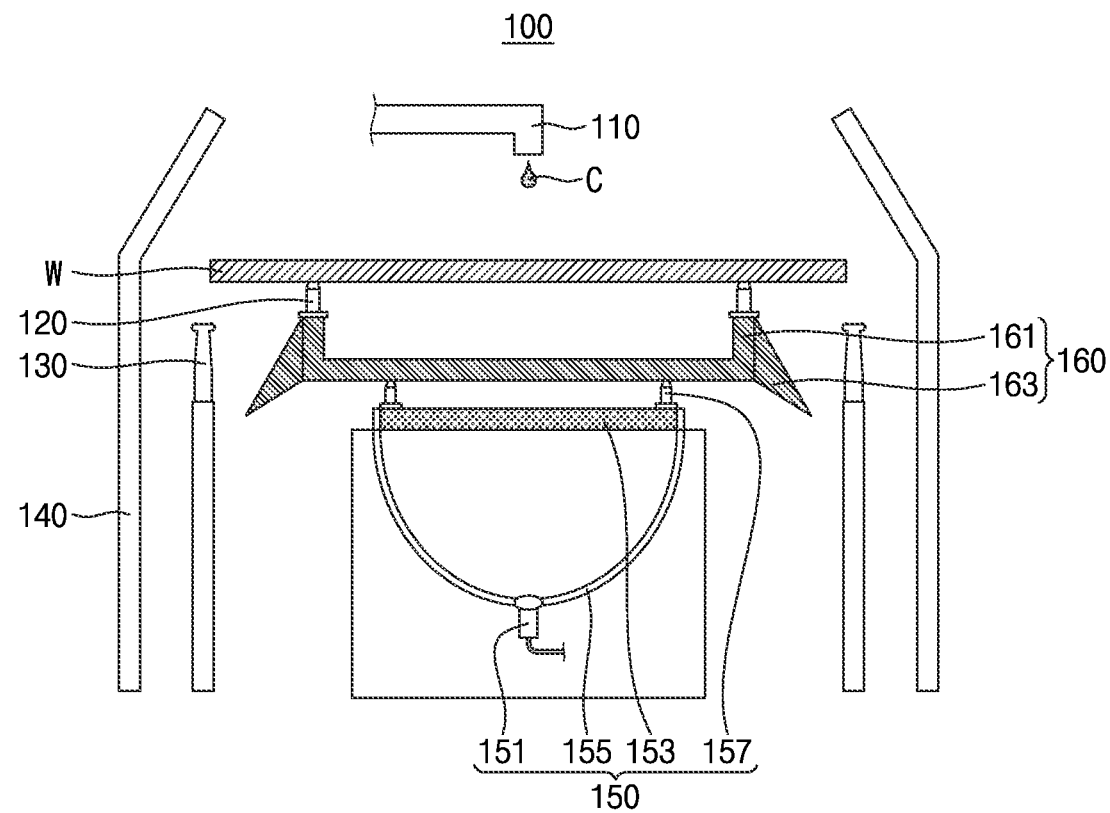
FIGS. 9 to 17 are cross-sectional views illustrating a wafer-cleaning method according to an embodiment of the inventive concept.

Referring to FIGS. 6 and 9, the wafer-cleaning apparatus 100 may supply the chemical liquid C to the wafer W (S610). The wafer-cleaning apparatus 100 may supply the chemical liquid C to the wafer W during a first time period. For example, a duration of the first time period may range from about 5 seconds to about 7 seconds. The wafer-cleaning apparatus 100 may supply the chemical liquid C to the wafer W through the nozzle 110. The wafer-cleaning apparatus 100 may supply a first amount of chemical liquid C to the wafer W. For example, the first amount may be about 100 cc or less.

Figure 10:
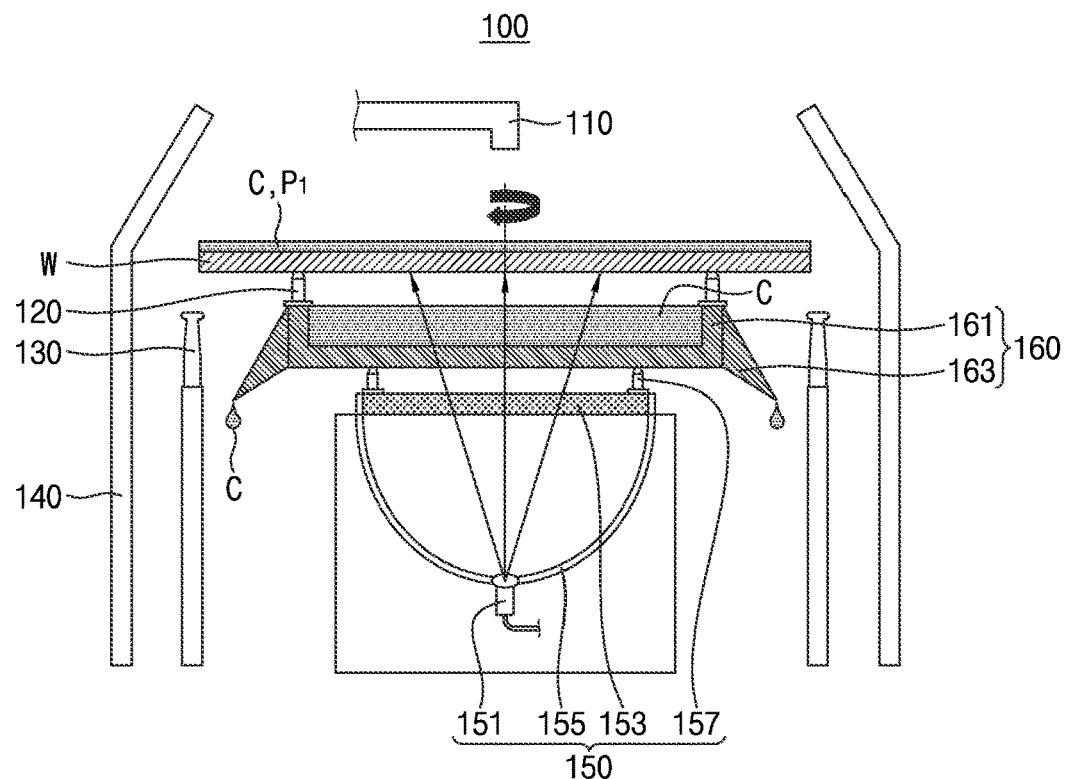

Referring to FIGS. 6, 7, and 10, the wafer-cleaning apparatus 100 may perform a first cleaning process on the wafer W (S620). The first cleaning process may include forming a first puddle $P_1$ on the upper surface of the wafer W (S621). The wafer-cleaning apparatus 100 may form the first puddle $P_1$ during a second time period. For example, a duration of the second time period may range from about 5 seconds to about 7 seconds.

The wafer-cleaning apparatus 100 may form the first puddle $P_1$ by increasing the temperature of the wafer W and rotating the wafer W so that the chemical liquid C is evenly distributed on the upper surface of the wafer W. The wafer-cleaning apparatus 100 may increase the temperature of the wafer W by providing first light to the wafer W via the light source 151, and may rotate the wafer W using the inner pins 120, thereby forming the first puddle $P_1$. The wafer-cleaning apparatus 100 may heat the wafer W from a first temperature to a second temperature via the first light, and may rotate the wafer W at a first speed. For example, the first temperature may be about 100° C. or less, the second temperature may range from about 180° C. to about 220° C., and the first speed may range from about 12 rpm to about 18 rpm.

Meanwhile, when the wafer W rotates, a portion of the chemical liquid C that is present on the upper surface of the wafer W may flow out of the wafer W and may be introduced into the window protector 160. The portion of the chemical liquid C that flows out of the wafer W may be introduced into the window protector 160 via the bowl 140. The chemical liquid C introduced into the window protector 160 may be stored in the tank 161. When more than a predetermined amount of chemical liquid C is introduced into the tank 161, an excess of the chemical liquid C may overflow the tank 161 and may flow to the drain 163. The excess of the chemical liquid C that flows to the drain 163 may drain into the bowl 140 along the upper surface of the drain 163.

The first cleaning process may include performing a first removal process on the wafer W with the first puddle $P_1$ (S623). The wafer-cleaning apparatus 100 may perform the first removal process on the wafer W during a third time period. For example, a duration of the third time period may range from about 50 seconds to about 70 seconds.

The wafer-cleaning apparatus 100 may perform the first removal process on the wafer W by supplying second light to the wafer W via the light source 151, and rotating the wafer W. In an embodiment, the wafer-cleaning apparatus 100 may supply second light to the wafer W to maintain the temperature of the wafer W at the second temperature, and may rotate the wafer W at a second speed. For example, the second speed may range from about 3 rpm to about 7 rpm. The first removal process may selectively remove silicon nitride and polysilicon from the upper surface of the wafer W.

When the wafer W rotates, a portion of the chemical liquid C that is distributed on the upper surface of the wafer W may flow out of the wafer W, and may be introduced into and stored in the tank 161. When more than a predetermined amount of chemical liquid C is introduced into the tank 161, an excess of the chemical liquid C may overflow the tank 161 and may flow to the drain 163. The excess of the chemical liquid C that flows to the drain 163 may drain into the bowl 140 along the upper surface of the drain 163.

Figure 11:
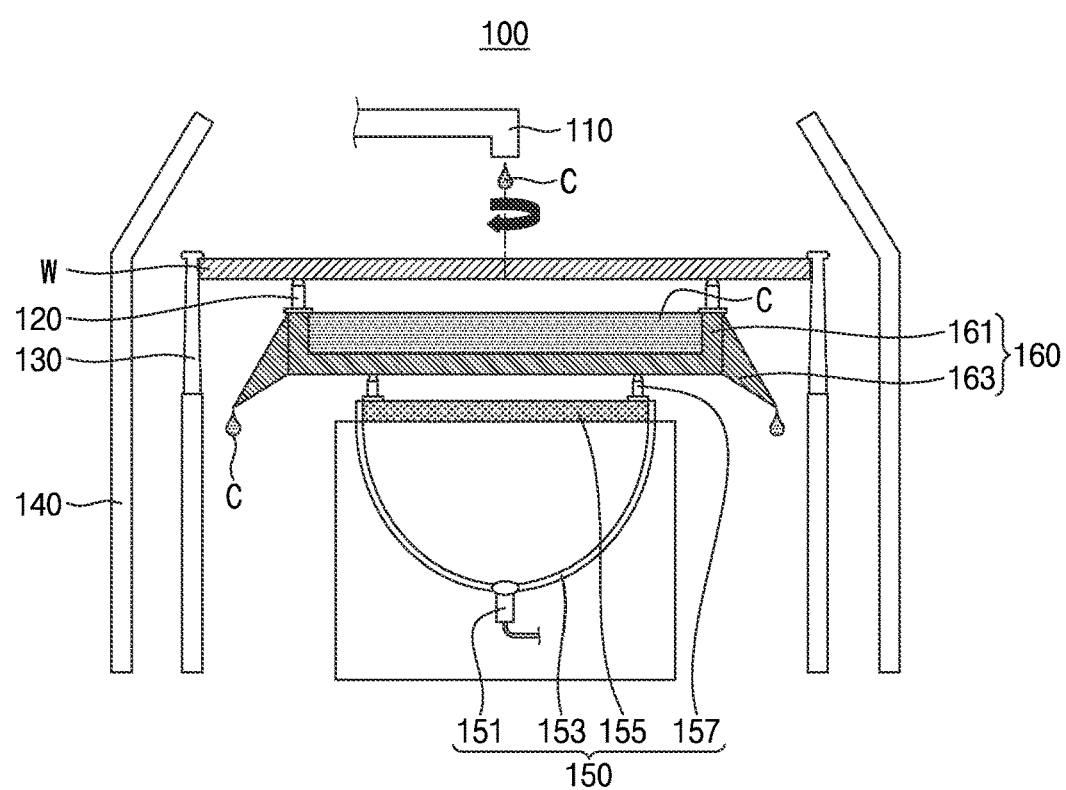
Figure 12:
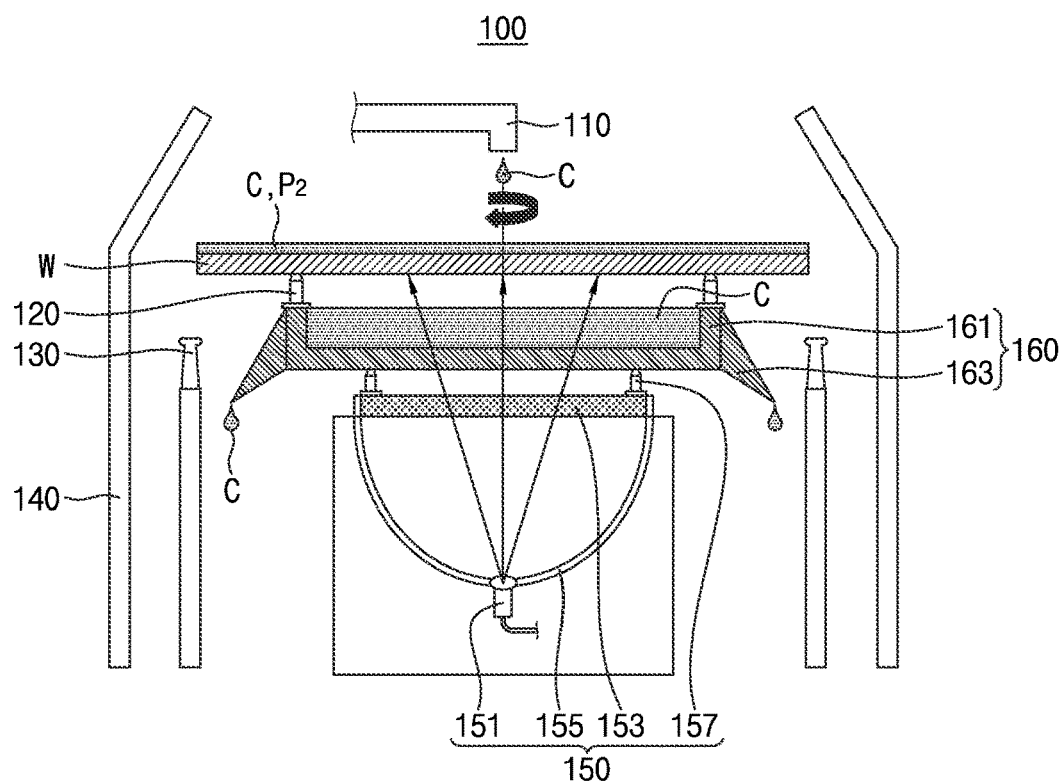
Figure 13:
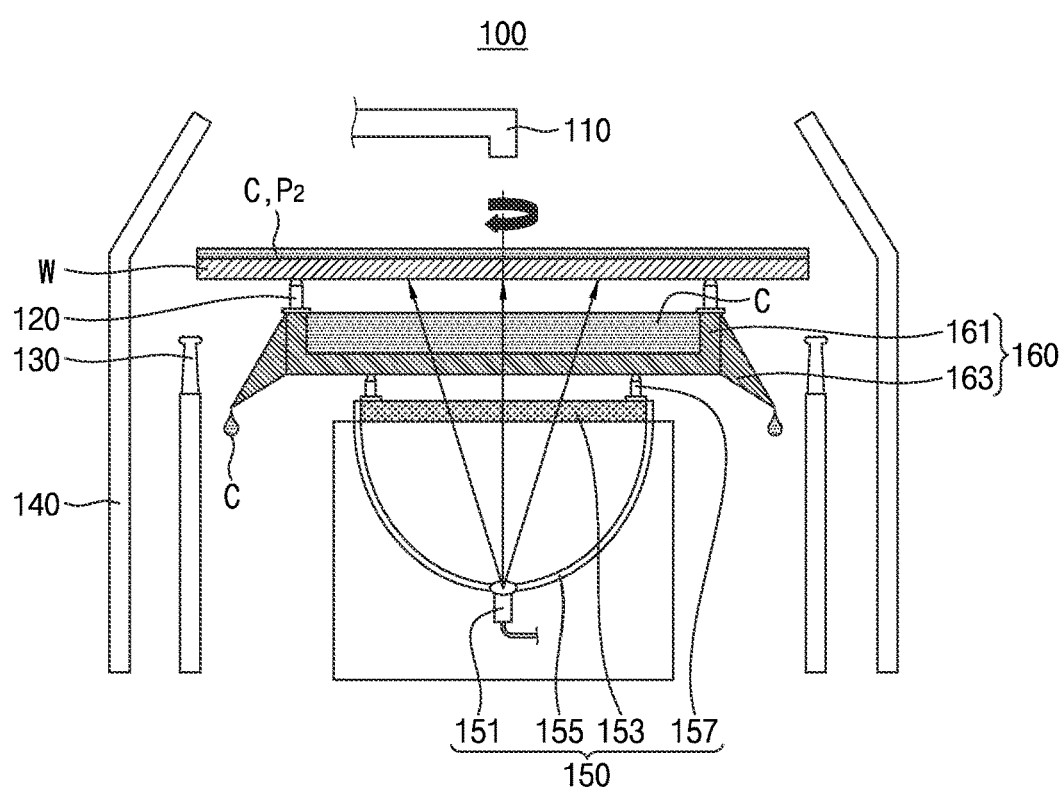

Referring to FIGS. 6 and 11, the wafer-cleaning apparatus 100 may perform a rinsing process on the wafer W (S630). The wafer-cleaning apparatus 100 may perform a rinsing process on the wafer W for a fourth time period. For example, a duration of the fourth time period may range from about 4 seconds to about 6 seconds.

The wafer-cleaning apparatus 100 perform the rinsing process on the wafer W by supplying a second amount of chemical liquid C to the wafer W and rotating the wafer W at a third speed. The second amount may be the same as the first amount, and the third speed may be greater than the first speed and the second speed. For example, the third speed may range from about 120 rpm to about 180 rpm.

When performing the rinsing process on the wafer W, the wafer-cleaning apparatus 100 may move the outer pins 130 upwards in the vertical direction, and the outer pins 130 may support the wafer W in the horizontal direction. Accordingly, when the wafer W rotates at the third speed that is greater than the first speed and the second speed, the wafer W may be prevented from being separated from the inner pins 120.

When the wafer-cleaning apparatus 100 performs the rinsing process on the wafer W, the temperature of the wafer W may drop from the second temperature to a third temperature. For example, the third temperature may range from about 100° C. to about 140° C. In an embodiment, the wafer-cleaning apparatus 100 may cool the wafer W with a cooling source included in the wafer-cleaning apparatus 100. For example, the cooling source may supply a cooling liquid (e.g., water) or a cooling gas (e.g., a refrigerant) to the wafer W. In an embodiment, the temperature of the wafer W may drop simultaneously when the rinsing process is performed on the wafer W.

Since the wafer-cleaning apparatus 100 may rotate the wafer W at the third speed that is greater than the first speed and the second speed, the chemical liquid C may not be distributed on the upper surface of the wafer W, but may be discharged from the wafer W. A portion of the chemical liquid C that is discharged from the wafer W may be introduced into and stored in the tank 161. When more than a predetermined amount of chemical liquid C is introduced into the tank 161, an excess of the chemical liquid C may overflow the tank 161 and may flow to the drain 163. The excess of the chemical liquid C that flows to the drain 163 may drain into the bowl 140 along the upper surface of the drain 163.

Referring to FIGS. 6, 8, 12, and 13, the wafer-cleaning apparatus 100 may perform a second cleaning process on the wafer W (S640). The second cleaning process may include forming a second puddle $P_2$ on the upper surface of the wafer W (S641). The wafer-cleaning apparatus 100 may form the second puddle $P_2$ during a fifth time period. A duration of the fifth time period may be less than the duration of the second time period. For example, the duration of the fifth time period may range from about 4 seconds to about 6 seconds.

The wafer-cleaning apparatus 100 may supply a third amount of chemical liquid C to the wafer W, may increase the temperature of the wafer W from the third temperature to a fourth temperature by supplying third light to the wafer W via the light source 151, and may rotate the wafer W at a fourth speed, thereby forming the second puddle $P_2$. For example, the fourth temperature may be the same as the second temperature.

The third amount and the fourth speed may decrease as the wafer-cleaning apparatus 100 forms the second puddle $P_2$. When the wafer-cleaning apparatus 100 starts to form the second puddle $P_2$, the third amount may be about 100 cc, and the fourth speed may be the same as the third speed. As the wafer-cleaning apparatus 100 forms the second puddle $P_2$, the third amount and the fourth speed may gradually decrease. When the wafer-cleaning apparatus 100 completely forms the second puddle, the third amount may be about 0 cc, and the fourth speed may be about 0 rpm.

When the wafer W rotates, a portion of the chemical liquid C that is distributed on the upper surface of the wafer W may flow out of the wafer W, and may be introduced into and stored in the tank 161. When more than a predetermined amount of chemical liquid C is introduced into the tank 161, an excess of the chemical liquid C may overflow the tank 161 and may flow to the drain 163. The excess of the chemical liquid C that flows to the drain 163 may drain into the bowl 140 along the upper surface of the drain 163.

The second cleaning process may include performing a second removal process on the wafer W with the second puddle P$_2$ (S643). The wafer-cleaning apparatus 100 may perform the second removal process on the wafer W during a sixth time period. For example, a duration of the sixth time period may be the same as the duration of the third time period.

The wafer-cleaning apparatus 100 may perform the second removal process on the wafer W by maintaining the temperature of the wafer W at the fourth temperature via fourth light supplied by the light source 151 and by rotating the wafer W at a fifth speed. For example, the fifth speed may be the same as the third speed.

When the wafer W rotates, a portion of the chemical liquid C that is distributed on the upper surface of the wafer W may flow out of the wafer W, and may be introduced into and stored in the tank 161. When more than a predetermined amount of chemical liquid C is introduced into the tank 161, an excess of the chemical liquid C may overflow the tank 161 and may flow to the drain 163. The excess of the chemical liquid C that flows to the drain 163 may drain into the bowl 140 along the upper surface of the drain 163.

Figure 14:
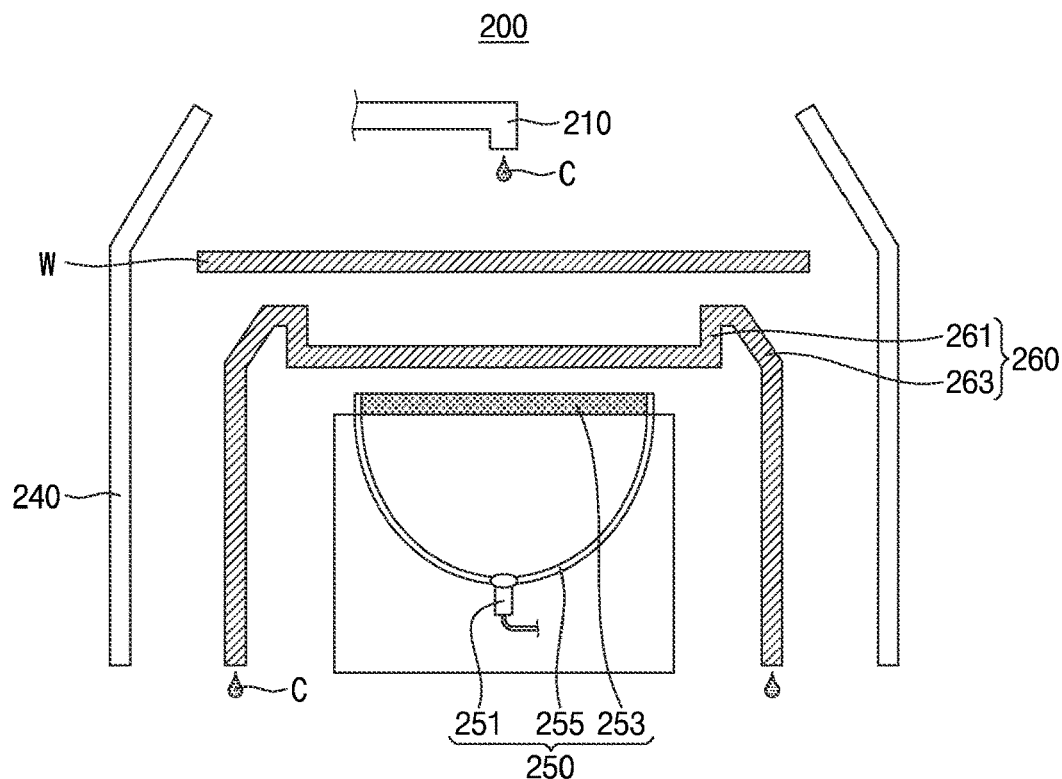
Figure 15:
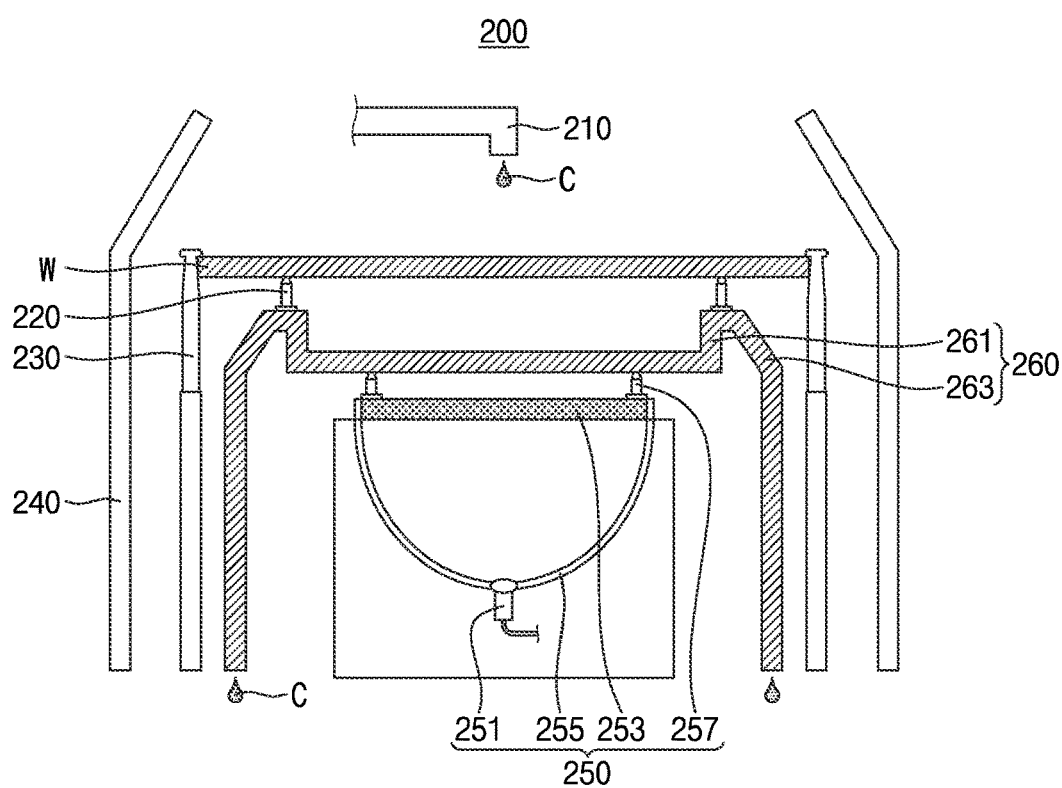

FIGS. 14 and 15 are cross-sectional views of a wafer-cleaning apparatus according to an embodiment of the inventive concept.

Referring to FIGS. 14 and 15, a wafer-cleaning apparatus 200 may include a nozzle 210, an inner pin 220, an outer pin 230, a bowl 240, a housing 250, and a window protector 260. The nozzle 210, the inner pin 220, the outer pin 230, the bowl 240 and the housing 250 may respectively correspond to the nozzle 110, the inner pin 120, the outer pin 130, the bowl 140 and the housing 150 shown in FIGS. 1 to 5. For example, the housing 250 may include a light source 251, a window 253, a reflector 255, and a support pin 257.

The window protector 260 may include a tank 261 and a drain 263. The tank 261 may include a hole in an upper portion of the tank but may otherwise be the same as the tank 161 shown in FIGS. 1 to 5. The hole may penetrate an inner surface and an outer surface of the tank 261. The hole may extend downwards in the vertical direction from the inner surface of the tank 261 to the outer surface of the tank.

The drain 263 may be disposed on an edge of the tank 261. The drain 263 may be a pipe including a first end that contacts the hole in the tank 261 and a second end that contacts an exterior of the wafer cleaning apparatus 200. In an embodiment, the drain 263 may include a compressor. The compressor may be disposed at an upper side of the drain 263.

When more than a predetermined amount of chemical liquid C is introduced into the tank 261, an excess of the chemical liquid C may be introduced to the drain 263 through the hole. In this case, the compressor may suction the chemical liquid C that is present in the hole so that the chemical liquid C is smoothly introduced into the drain 263. The chemical liquid C introduced into the drain 263 may be discharged outside of the wafer-cleaning apparatus 200.

Figure 16:
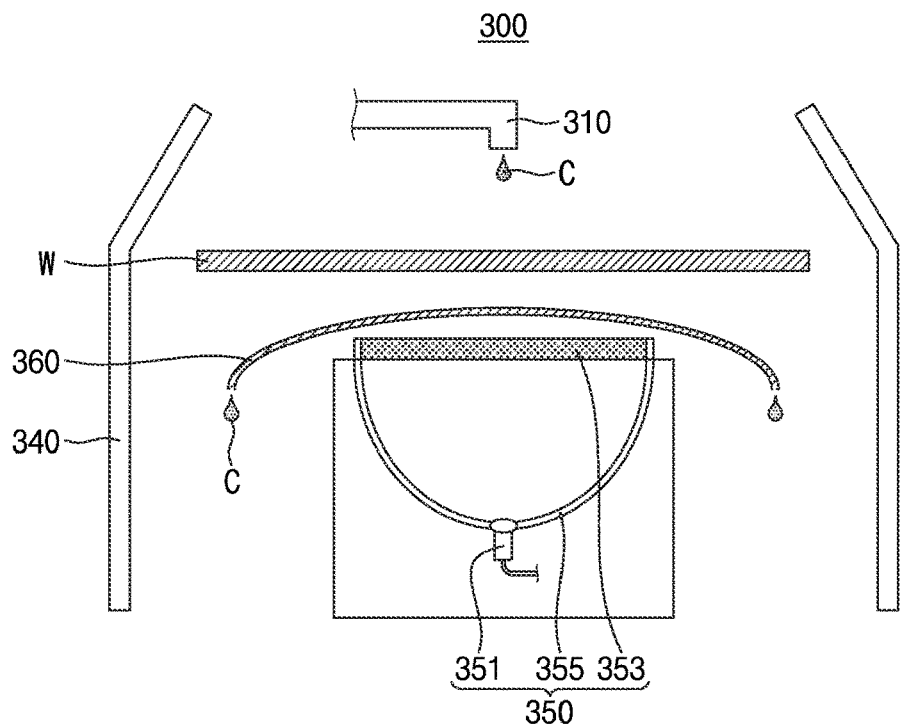
Figure 17:
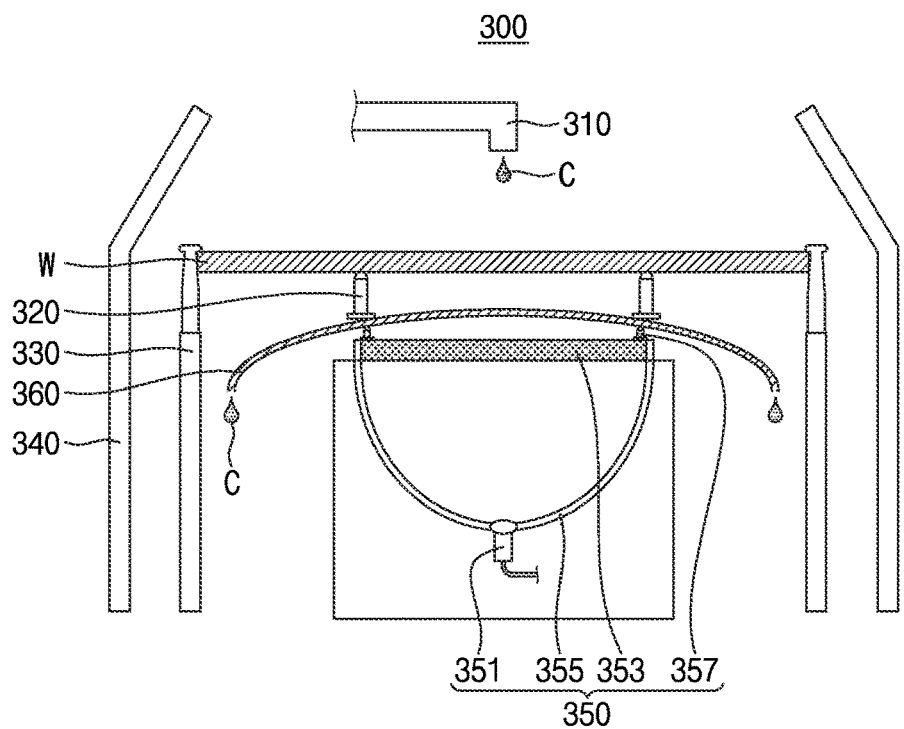

FIGS. 16 and 17 are cross-sectional views of a wafer-cleaning apparatus according to an embodiment of the inventive concept.

Referring to FIGS. 16 and 17, a wafer-cleaning apparatus 300 may include a nozzle 310, an inner pin 320, an outer pin 330, a bowl 340, a housing 350, and a window protector 360. The nozzle 310, the inner pin 320, the outer pin 330, the bowl 340, and the housing 350 may respectively correspond to the nozzle 110, the inner pin 120, the outer pin 130, the bowl 140, and the housing 150 shown in FIGS. 1 to 5.

The window protector 360 may have a convex shape that curves toward the wafer W. The window protector 360 may be made of a material that prevents the chemical liquid C from gathering on the surface of the window protector 360 and prevents light supplied to the wafer W from a light source 351 from scattering. When the wafer W rotates, a portion of the chemical liquid C may flow to the window protector 360 from the wafer W. The portion of the chemical liquid C that flows to the window protector 360 may be discharged to the bowl 340 along a surface of the window protector 360.

According to an embodiment of the inventive concept, a window protector of a wafer-cleaning apparatus may prevent a window of a wafer-cleaning apparatus from being contaminated by a chemical liquid, and thus light emitted from a light source of the wafer-cleaning apparatus may be supplied to a lower portion of a wafer without scattering.

According to an embodiment of the inventive concept, an etching rate of the wafer may be uniform irrespective of the position of the wafer.

While the inventive concept has been particularly shown and described with reference to embodiments thereof, it will be understood by one of ordinary skill in the art that variations in form and detail may be made therein without departing from the scope of the present disclosure.

What is claimed is:

1. An apparatus, comprising:
   an inner pin, wherein the inner pin supports a wafer;
   a nozzle disposed above the inner pin and the wafer, wherein the nozzle supplies a chemical liquid to the wafer and wherein the inner pin distributes a portion of the chemical liquid on an upper surface of the wafer by rotating the wafer;
   a bowl;
   a light source disposed under the inner pin;
   a window disposed between the light source and the wafer; and
   a window protector disposed between the wafer and the window, and comprising:
      a tank configured to store the portion of chemical liquid received by the window protector; and
      a drain disposed on an edge of the tank to discharge an excess of the chemical liquid overflowing the tank into the bowl,
   wherein the window protector receives a portion of the chemical liquid that flows out of the wafer and wherein the light source supplies light to the wafer through the window protector and the window.

2. The apparatus of claim 1, further comprising:
   an outer pin disposed on an edge of the wafer, wherein the outer pin supports the wafer.

3. The apparatus of claim 1, wherein a hydrophobic film coats a surface of the drain.

4. The apparatus of claim 1, further comprising a heat source, and wherein the heat source heats the drain.

5. The apparatus of claim 1, wherein the drain includes a plurality of holes.

6. The apparatus of claim 1, further comprising a support pin disposed on a reflector and supporting the window protector, and wherein at least one of the inner pin or the support pin discharges the excess of the chemical liquid from the drain by at least one of vibrating the drain or rotating the drain.

7. The apparatus of claim 1, wherein the tank includes a hole in an upper portion of the tank,
wherein the hole penetrates an inner surface and an outer surface of the tank,
wherein the drain is a pipe that contacts the hole, and
wherein the drain discharges the excess of the chemical liquid to outside of the wafer-cleaning apparatus.

8. The apparatus of claim 7, wherein the drain comprises a compressor configured to suction chemical liquid disposed in the hole.

9. The apparatus of claim 1, wherein the window protector has a convex shape that curves toward the wafer.

10. An apparatus, comprising:
an inner pin, wherein the inner pin supports a wafer;
a nozzle disposed above the inner pin and the wafer, wherein the nozzle supplies a chemical liquid to the wafer and wherein the inner pin distributes a portion of the chemical liquid on an upper surface of the wafer by rotating the wafer;
an outer pin disposed under the nozzle and on an edge of the wafer, wherein the outer pin supports the wafer;
a bowl, wherein the bowl at least partially surrounds the outer pin and blocks outflow of the chemical liquid to outside of the wafer-cleaning apparatus;
a light source disposed under the inner pin;
a window disposed between the light source and the wafer;
a reflector connecting the light source and an edge of the window;
a window protector disposed between the wafer and the window, wherein the window protector receives a portion of the chemical liquid that flows out of the wafer and wherein the light source supplies light to the wafer through the window and the window protector; and
a support pin disposed between the window and the window protector,
wherein the support pin supports the window protector, and
wherein the window protector comprises:
a tank configured to store the portion of the chemical liquid that is received by the window protector; and
a drain disposed on an edge of the tank to discharge an excess of the chemical liquid overflowing the tank into the bowl.

11. The apparatus of claim 10, wherein either a hydrophobic film coats a surface of the drain or the drain includes a plurality of holes, and
wherein at least one of the inner pin or the support pin discharges the excess of the chemical liquid from the drain by at least one of vibrating the drain or rotating the drain.

12. An apparatus, comprising:
an inner pin, wherein the inner pin supports a wafer;
a nozzle disposed above the inner pin and the wafer, wherein the nozzle supplies a chemical liquid to the wafer and wherein the inner pin distributes a portion of the chemical liquid on an upper surface of the wafer by rotating the wafer;
a light source disposed under the inner pin;
a window disposed between the light source and the wafer;
a window protector disposed between the wafer and the window, and
at least one support pin disposed between and connecting the window and the window protector and supporting the window protector,
wherein the window protector receives a portion of the chemical liquid that flows out of the wafer and wherein the light source supplies light to the wafer through the window protector and the window.

13. The apparatus of claim 12, wherein:
the at least one support pin is disposed on the window.

14. The apparatus of claim 12, further comprising:
a reflector connecting the light source and an edge of the window,
wherein the at least one support pin is disposed on the reflector.

15. The apparatus of claim 12, further comprising:
a plurality of support pins including the at least one support pin, wherein the plurality of support pins is arranged in a circular shape.

16. The apparatus of claim 15, wherein:
six support pins of the plurality of support pins are spaced apart from each other by about 60 degrees, eight support pins of the plurality of support pins are spaced apart from each other by about 45 degrees, or twelve support pins of the plurality of support pins are spaced apart from each other by about 30 degrees.

17. The apparatus of claim 12, wherein:
the window protector includes a drain.

18. The apparatus of claim 17, wherein:
at least one of the inner pin and the at least one support pin is configured to discharge the chemical liquid from the drain by vibrating the drain.

19. The apparatus of claim 17, wherein:
at least one of the inner pin and the at least one support pin is configured to discharge the chemical liquid from the drain by rotating the drain.

20. The apparatus of claim 17, further comprising:
a hydrophobic film covering the drain.

* * * * *